United States Patent [19]

Fukui et al.

[11] Patent Number: 5,021,321
[45] Date of Patent: Jun. 4, 1991

[54] PHOTOSENSITIVE MEMBER AND MULTI-COLOR IMAGE FORMING METHOD

[75] Inventors: Tetsuro Fukui, Kawasaki; Masato Katayama, Yokohama; Akihiro Mouri, Kokubunji; Kazuo Isaka, Tokyo; Kenji Kagami, Atsugi; Masao Suzuki, Tokyo, all of Japan

[73] Assignee: Canon Kabushiki Kaisha, Tokyo, Japan

[21] Appl. No.: 564,060

[22] Filed: Aug. 8, 1990

[30] Foreign Application Priority Data

Aug. 10, 1989 [JP] Japan ................ 1-205626

[51] Int. Cl.⁵ .................... G03C 5/54; G03C 1/46; G03C 1/68
[52] U.S. Cl. .................... 430/201; 430/138; 430/199; 430/202; 430/203; 430/222; 430/270; 430/327; 430/328; 430/543; 430/552; 430/554; 430/556
[58] Field of Search ............. 430/138, 199, 200, 201, 430/202, 203, 222, 270, 327, 328, 543, 552, 554, 556

[56] References Cited

U.S. PATENT DOCUMENTS

| | | | |
|---|---|---|---|
| 3,245,796 | 4/1966 | Burg | 430/201 |
| 4,587,198 | 5/1986 | Fisch | 430/201 |
| 4,624,910 | 11/1986 | Takeda | 430/203 |
| 4,629,676 | 12/1986 | Hayakawa et al. | 430/203 |
| 4,649,098 | 3/1987 | Takeda et al. | 430/203 |

*Primary Examiner*—Richard L. Schilling
*Attorney, Agent, or Firm*—Fitzpatrick, Cella, Harper & Scinto

[57] ABSTRACT

A photosensitive member suitable for multi-color image formation is obtained by forming a plurality of photosensitive layers laminated on a substrate. Each photosensitive layer comprises a matrix phase and particles dispersed therein. The matrix phase contains a photosensitive silver salt, an organic silver salt and a reducing agent which react with each other on exposure and heating to form a light-absorbing organic compound. The particles contain a heat-diffusive colorant, a polymerizable polymer precursor and a photopolymerization initiator. The light-absorbing organic compound in a photosensitive layer being capable of absorbing a wavelength of light to which the photopolymerization initiator in the photosensitive layer is sensitive. Because the heat-diffusive colorant, the polymerizer and the initiator are contained in the particles, the diffusion of the heat-diffusive colorant can be effectively controlled to prevent color fog.

15 Claims, 1 Drawing Sheet

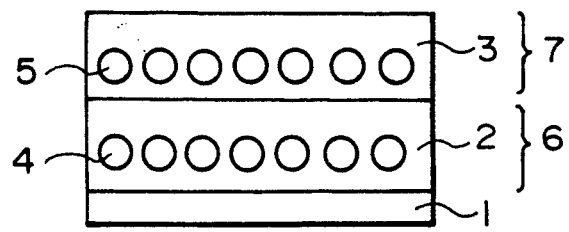
F I G. I
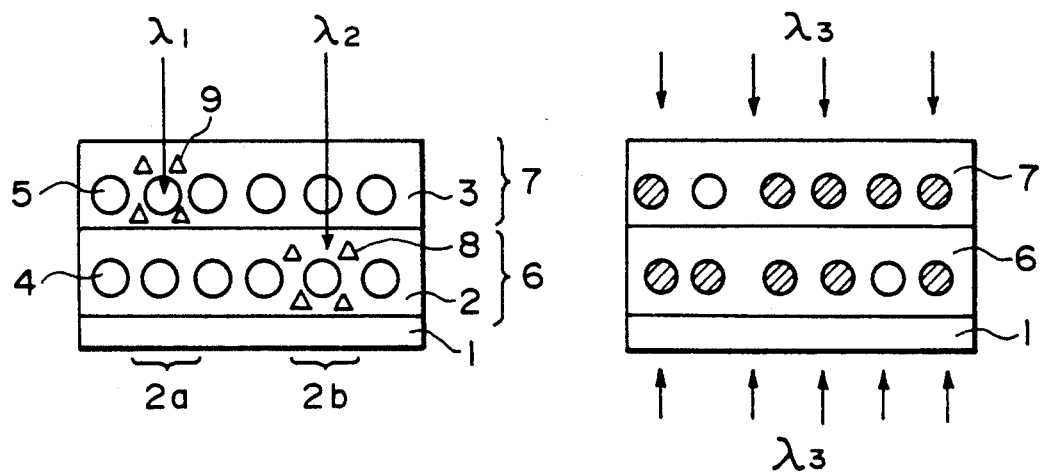
F I G. 2A
F I G. 2C
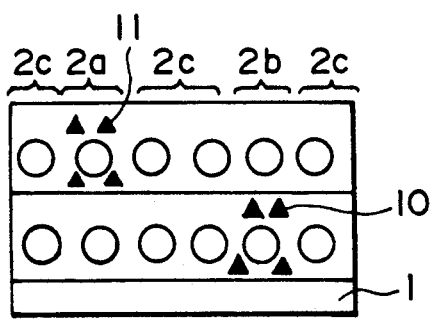
F I G. 2B
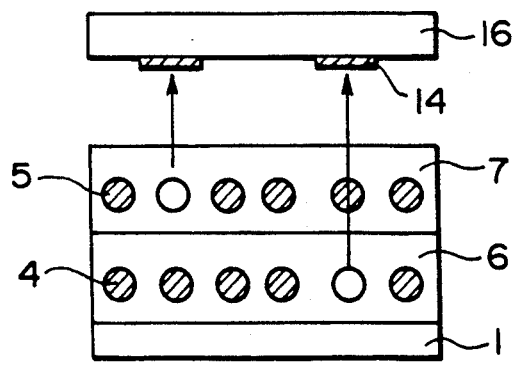
F I G. 2D

PHOTOSENSITIVE MEMBER AND MULTI-COLOR IMAGE FORMING METHOD

FIELD OF THE INVENTION AND RELATED ART

The present invention relates to a dry silver salt-type photosensitive member and a multi-color image forming method using the photosensitive member.

Energies used to form or record an image include light, sound, electricity, magnetism, heat, radiations such as electron rays and X-rays, and chemical energy, among which, in particular, widely used are light, electricity, heat energy, or a combination of any of these.

For example, the image forming method that employs the combination of light energy with chemical energy includes a silver salt photographic process and a method in which a diazo copying paper is used. The method that employs the combination of light energy with electric energy includes an electrophotographic system. Also, the method that utilizes heat energy includes a method in which a thermal recording paper or transfer recording paper is used. On the other hand, known as the method that utilizes electric energy is a method in which an electrostatic recording paper, electrothermal recording paper, or electrosensitive recording paper is used.

Of the above image forming methods, the silver salt photographic process can provide an image having a high resolution. The silver salt photographic process, however, requires the developing and fixing that uses complicated liquid compositions, or the drying of an image (or a print). Now, development is extensively made on image forming methods that can provide an image through a simple processing.

For example, U.S. Pat. No. 4,629,676 teaches a method in which polymerization reaction under dry (thermal) conditions is caused by the photosensitive reaction of silver halide that act as a trigger, to form an image comprising a polymer. In order to accelerate the polymerization, Japanese Laid-open patent Application (Kokai) JP-A 62-70836 discloses a method in which a thermal polymerization initiator is used. In addition, U.S. Pat. No. 4,649,098 discloses a method in which a reducing agent having a polymerization-inhibiting power is converted into an oxidized product by imagewise consumption (at imagewise exposed areas) in the course of the developing of silver halide so as to leave the remaining reducing agent with an imagewise inhibiting power for polymerization reaction and then light energy is uniformly applied (whole area exposure) from the outside to cause photopolymerization at the area at which the reducing agent has been consumed (imagewise exposed area), thus forming a polymer image.

Further, Japanese Patent Appln. Sho 61-45241 discloses a process wherein a medium containing a dye or pigment is caused to have an image comprising a polymerized part (area) and an unpolymerized part (area) which provide different evaporation speeds of the aye or pigment when the medium is heated, to form a color image.

The above-mentioned process for forming an image through utilization of the polymerized part and the unpolymerized part still leaves a room for improvement in respects of polymerization sensitivity and contrasts between the polymerized part and the unpolymerized part.

SUMMARY OF THE INVENTION

A principal object of the present invention is to provide a photosensitive member and an image forming method capable of forming a multi-color image which has a good contrast and is free from color-fog.

According to the present invention, there is provided a photosensitive member, comprising: a substrate, and a plurality of photosensitive layers laminated on the substrate;

each photosensitive layer comprising a matrix phase and particles dispersed therein, the matrix phase comprising a photosensitive silver salt, an organic silver salt and a reducing agent which react with each other on exposure and heating to form a light-absorbing organic compound, the particles comprising a heat-diffusive colorant, a polymerizable polymer precursor and a photopolymerization initiator, the light-absorbing organic compound in a photosensitive layer being capable of absorbing a wavelength of light to which the photopolymerization initiator in the photosensitive layer is sensitive.

According to another aspect of the present invention, there is provided an image forming method of forming an image by using a photosensitive member which comprises a substrate, and a plurality of photosensitive layers laminated on the substrate; each photosensitive layer comprising a matrix phase and particles dispersed therein; the matrix phase comprising a photosensitive silver salt, an organic silver salt and a reducing agent which react with each other on exposure and heating to form a light-absorbing organic compound; the particles comprising a heat-diffusive colorant, a polymerizable polymer precursor and a photopolymerization initiator; the light-absorbing organic compound in a photosensitive layer being capable of absorbing a wavelength of light to which the photopolymerization initiator in the photosensitive layer is sensitive; the image forming method comprising:

an imagewise exposure step for subjecting the photosensitive member to imagewise exposure to form a latent image in at least one of the photosensitive layers, a heating step for heating the photosensitive member to form a light-absorbing organic compound in the photosensitive layers corresponding to the latent image, a polymerization exposure step for exposing the photosensitive member to provide the particles with different polymerization states due to the light-absorbing characteristic of the light-absorbing organic compound, and a transfer step for heating the photosensitive member to transfer the heat-diffusive colorant to an image-receiving member depending on the polymerization states of the particles containing the heat-diffusive colorant.

These and other objects, features and advantages of the present invention will become more apparent upon a consideration of the following description of the preferred embodiments of the present invention taken in conjunction with the accompanying drawings.

BRIEF DESCRIPTION OF THE DRAWING

FIG. 1 is a schematic sectional view of an embodiment of the photosensitive member according to the present invention.

FIGS. 2A-2D are schematic sectional views of a photosensitive member for illustrating an embodiment

DETAILED DESCRIPTION OF THE INVENTION

As shown in FIG. 1, a photosensitive member according to the present invention comprises a substrate 1, and a photosensitive layer 6 and a photosensitive layer 7 laminated in that order on the substrate 1. The photosensitive layers 6 and 7 comprise matrix phases 2 and 3, in which particles 4 and 5 are dispersed, respectively. Each of the particles 4 and 5 comprises at least a heat-diffusive colorant, a polymerizable polymer precursor and a photopolymerization initiator. On the other hand, each of the matrix phases 2 and 3 comprises at least a photosensitive silver salt, an organic silver salt and a reducing agent.

In the photosensitive member according to the present invention, when the photosensitive layer 6 (or 7) is exposed and heated (thermally developed), the organic silver salt and reducing agent contained in the photosensitive layer 6 (or 7) cause an oxidation-reduction reaction to yield an oxidation product (oxidized product), which may function as a light-absorbing organic compound. It is also possible that the oxidation product between the organic silver salt and the reducing agent reacts further with a coupler to form a light-absorbing organic compound.

Image formation by using the above-mentioned photosensitive member may be effected in a manner as will be explained hereinbelow with reference to FIGS. 2A-2D. In an imagewise exposure step (a) as shown in FIG. 2A, photosensitive layers 6 and 7 are subjected to analogue exposure by means of a mask etc., or digital exposure of applying image signals of external electric signals or light signals by means of a laser, etc. Thus, a desired imagewise exposure may effected by using light of, e.g., two wavelengths $\lambda_1$, and $\lambda_2$. Now, it is assumed that the photosensitive layer 6 contains a photosensitive silver salt sensitive to the light of $\lambda_1$ and the photosensitive layer 7 contains a photosensitive silver salt sensitive to the light of $\lambda_2$. As a result, silver nuclei 9 are formed at an exposed part 2a and silver nuclei 8 are formed at an exposed part 2b to provide a latent image.

The exposure conditions for the latent image formation may be selected appropriately depending on factors, such as the concentration and the kind of a photosensitive silver salt (e.g., a silver halide), etc., contained in the photosensitive layer. The imagewise exposure at this stage may be effected by using three or more wavelengths of light instead of the two wavelengths of light depending on various conditions including multi-color images to be formed and photosensitivities of the photosensitive layers. Different wavelengths of light may be irradiated simultaneously or separately. The present invention allows writing at a high sensitivity because a photosensitive silver salt such as a silver halide is used in this step.

Next, in a heating (thermal development) step (b) as shown in FIG. 2B, the photosensitive layers 6 and 7 having latent images therein are heated whereby the silver nuclei 8 and 9 in the exposed parts 2a and 2b, respectively, function as catalysts to cause a reaction between an organic silver salt and a reducing agent at each exposed part. As a result, the organic silver salt is reduced into silver atom (metal silver) while the reducing agent is reduced into an oxidation product 10 or 11, which has light-absorptivity.

The heating in this step (b) may be effected so as to appropriately select conditions for effecting the oxidation-reduction. More specifically, the heating may be effected at 60° C.–200° C., preferably 100° C.–150° C., for 1 sec. to 5 min., preferably 3 sec. to 60 sec, while these may depend on the compositions of the photosensitive layers, etc. A shorter period is required at a higher temperature, and a longer period is required at a lower temperature. The heating may for example be effected by means of a hot plate, heat rollers and a thermal head, or may also be effected by energizing heat-generating elements provided on the substrate or by irradiation with laser light or near-infrared rays.

In a polymerization step (c) as shown in FIG. 2C, the photosensitive layers 6 and 7 are exposed to light with a wavelength of $\lambda_3$ from their one side or both sides (as shown) for polymerization.

When the whole areas of the photosensitive layers 6 and 7 are exposed for polymerization, the polymerizable polymer precursor in the particles is causes to polymerize under the action of the photopolymerization initiator in the particles at the imagewise unexposed parts 2b and 2c (except for the imagewise exposed part 2a) in the photosensitive layer 7 and at the imagewise unexposed parts 2a and 2c (except for the imagewise exposed part 2b). Herein, the term "polymerization" is intended to also cover a case where only crosslinking occurs. On the other hand, at the imagewise exposed part 2a in the photosensitive layer 7 and the imagewise exposed part 2b in the photosensitive layer 6, a light-absorbing organic compound is present so that the wavelength of light for polymerization exposure is absorbed thereby to hinder the progress of the polymerization relative to the imagewise unexposed parts. As a result, the particles are caused to have different polymerization states, thus resulting in a polymerization image comprising a distribution of polymerized particles and unpolymerized particles as shown in FIG. 2C.

The light used in the polymerization step for exposing the photosensitive layers 6 and 7 is an effective wavelength light having a wavelength to which the photopolymerization initiator (in a sense of including a sensitizer, herein) is sensitive and which can be absorbed by the light-absorbing organic compound.

However, it is also possible to use another wavelength of light in addition to the effective wavelength light as far as a desired polymerization image can be obtained. In case where a limited wavelength of light is required, the exposure may be effected by using a cut filter, etc.

In the present invention, if there is a substantial difference between the wavelength at which the light-absorbing organic compound shows an absorption peak and the wavelength at which the photopolymerization initiator shows an absorption peak, the function of the light-absorbing organic compound is lowered so that it becomes difficult to obtain a clear image.

The absorption peak wavelengths of the light-absorbing organic initiator may be correlated in a similar manner as in Japanese Patent Application No. 259728/1989. More specifically, it is preferred that the photopolymerization initiator shows an absorption peak wavelength $\lambda_6$ which is within the range of $\lambda_3 \pm 0.8$ $W_{\frac{1}{2}}$, further preferably $\lambda_3 \pm 0.5$ $W_{\frac{1}{2}}$, wherein $\lambda_3$ and $W_{\frac{1}{2}}$ denote the absorption peak wavelength and the half-value wavelength width, respectively, of the light-absorbing organic compound.

Herein, it is preferred that the glass transition point of the unpolymerized particles $Tg_1$ and the glass transitions point of the polymerized particles $Tg_2$ satisfy the relationship of: $Tg_2 - Tg_1 > 30°$ C.

Examples of the light sources used in the imagewise exposure step (a) and the polymerization step (c) may include: sunlight, tungsten lamp, mercury lamp, halogen lamp, xenon lamp, fluorescent lamp, LED (light emission device) and laser. The lights used in these steps (a) and (c) may have the same wavelength or different wavelengths. In case where the same wavelength of light is used, a latent image formation in the imagewise exposure step (a) may be sufficiently effected at an intensity of light which does not cause a substantial degree of photopolymerization since a photosensitive silver salt such as a silver halide generally has a sufficiently higher photosensitivity than a photopolymerization initiator. For example, the imagewise exposure may be effected by using light with an intensity of up to about 1 mJ/cm on the surface of the photosensitive member, and the polymerization exposure may be effected by using light with an intensity of up to about 500 mJ/cm² on the surface of the photosensitive member. Plural kinds of light having specific wavelengths, such as $\lambda_1$, $\lambda_2$, etc., for use in imagewise exposure may be emitted from light sources, such as LED, laser, etc.

It is further possible to effect the exposure in the step (c) under heating. The heat may be given anew in this step or as a residual heat from the preceding polymerization step (b).

In a transfer step (d) shown in FIG. 2D, an image-receiving member 16 is disposed to face the photosensitive layers 6 and 7 and the photosensitive layers 6 and 7 are heated. As a result, a heat-diffusive colorant in an unpolymerized particle is transferred to the image-receiving member 16, while the heat-diffusive colorant in a polymerized particle is not transferred to the member 16 because its diffusivity under heating is suppressed by the polymerization. Consequently, a good multi-color image 14 may be formed on the image-receiving member 16, corresponding to the lights having wavelengths $\lambda_1$ and $\lambda_2$ used the image-exposure step (a). It is further possible to control the transferred amount of the heat-diffusive colorant depending on the degree of polymerization of the polymerizable polymer precursor in the particles, so that an image having a density gradation can also be easily formed. The heating temperature T in this step may preferably satisfy the relationship of $Tg_1 < T < Tg_2$.

In the present invention, each of the particles 4 and 5 comprises at least a heat-diffusive colorant, a polymerizable polymer precursor and a photopolymerization initiator, whereby color fog can be prevented. More specifically, in a photosensitive layer formed by mixing the heat-diffusive colorant and polymerizable polymer precursor together with a photosensitive silver salt and a reducing agent, the heat-diffusive colorant is present also on the surface of the photosensitive layer. In this case, the diffusion of the heat-diffusive colorant cannot be sufficiently suppressed even after the polymerizable polymer precursor is polymerized in the step (c). Thus, the resultant image is accompanied with color fog.

On the other hand, in the photosensitive member of the present invention, the heat-diffusive colorant is contained in the particles together with the polymerizable polymer precursor, etc., so that the diffusion of the heat-diffusive colorant is effectively suppressed, if the particles are polymerized, to prevent color fog and result in very good images.

As described hereinbefore, the photosensitive layer produces a light-absorbing organic compound when subjected to exposure and heating (thermal development).

The light-absorbing organic compound may include one which absorbs ultraviolet rays in addition to those absorbing visible rays. Further, the light-absorbing organic compound is not restricted to those absorbing the entire wavelength range of light to which the photopolymerization initiator is sensitive but can be one which absorbs a part of the sensitive wavelength range of the photopolymerization initiator to such an extent that the sensitivity of the photopolymerization initiator is reduced.

The light-absorbing organic compound may be produced from the reducing agent and the organic silver salt. More specifically, the organic silver salt and the reducing agent in the photosensitive layer causes oxidation-reduction to form such a light-absorbing organic compound. Simultaneously, metal silver may ordinarily be formed, but the absorption by the metal silver is not positively utilized in the present invention. The metal silver does not show a large absorption peak.

According to the present invention, a polymerization image having a large contrast can be obtained with a sufficient stability. This may be attributable to the following reasons.

In case where the polymerization is a thermal one, and the oxidation reduction between the organic silver salt, etc., and the reducing agent and the polymerization of the polymer precursor are performed in a single step, these reactions become competitive and cannot be effectively performed. To the contrary, in the present invention, the polymerization of the polymer precursor is a photo-polymerization, and these reaction steps are performed separately as by heating and exposure, respectively. Accordingly, both reactions are not affected by each other but can be performed effectively, so that a polymerization image having a sufficiently large contrast may presumably be obtained.

In case where such a reducing agent as originally having a polymerization inhibiting power which is lowered when converted into an oxidized product through oxidation-reduction is used, a sufficiently large difference in polymerization inhibiting power may not be available, thus failing to provide a polymerization image with a sufficient contrast.

In contrast thereto, in the case of using a light-absorbing substance, the difference in polymerization inhibiting power can be very large to provide a large difference in polymerization velocity between the imagewise exposed part and unexposed part, thus providing a polymerization image with a further large contrast. Therefore, a polymerization image having a sufficient contrast can be stably obtained even if various conditions inclusive of compositions of photosensitive layers, exposure quantity and heating temperature vary to some extent.

Hereinbelow, the respective components constituting the photosensitive layers of the photosensitive member or medium according to the present invention will be described in detail.

The photosensitive silver salt, organic silver salt and reducing agent contained in the matrix phase will be described first of all.

The photosensitive silver salt used in the medium of the present invention may include silver halides, such as silver chloride, silver bromide, silver chlorobromide, silver iodobromide, and silver chloroiodobromide. These may be or may have been subjected to chemical sensitization or optical sensitization as done in respect of usual photographic emulsions. More specifically, the chemical sensitization that can be used includes sulfur sensitization, noble metal sensitization, and reduction sensitization. The optical sensitization that can be applied includes methods using conventionally known sensitizing dyes.

The sensitizing dyes that may be preferably used include cyanine dyes, merocyanine dyes, and trinuclear dyes, as exemplified by 3,3'-dicarboxyethyl-2,2'-thiacarbocyanine iodide, 3,3'-diethyl-2,2'-thiacarbocyanine iodide, 3,3'-disulfoethyl-2,2'-thiadicarbocyanine bromide, 3,3'-diethyl-2,2'-thiatricarbocyanine iodide, and further dyes having the following structural formula:

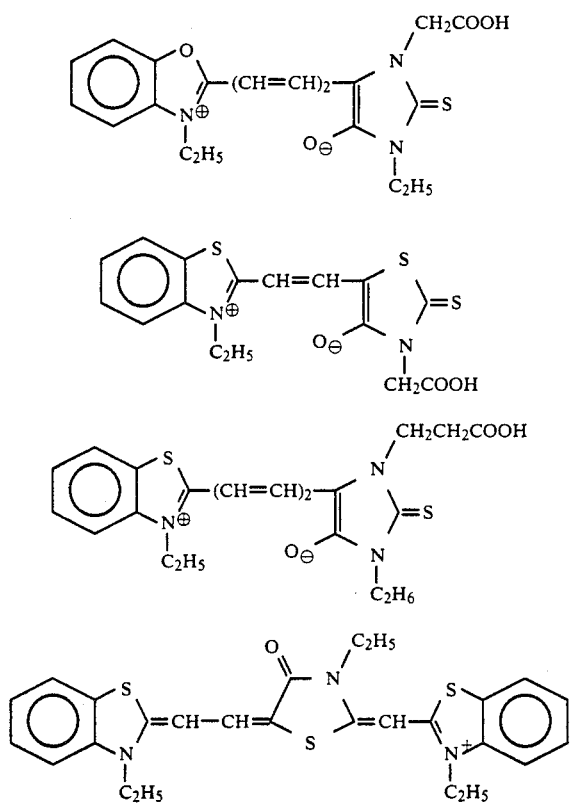

The silver halide as a photosensitive salt may have a uniform crystalline structure or a multi-layer crystalline structure having locally different compositions, e.g., one having a core of AgBr covered with an outer layer of AgI. It is also possible to use simultaneously two or more kinds of silver halides having different halogen compositions, grain sizes, grain size distributions, etc.

The organic silver salt that can be used in the medium of the present invention includes organic acid silver salts or triazole silver salts as described in SHASHIN KOGAKU NO KISO (Basic Photographic Engineering), First Edition, published 1982, The Non-silver Salt Volume, p.247, or Japanese Laid-Open Patent Application JP-A 59-55429. It is preferred to use silver salts having a low or no photosensitivity. They include, for example, silver salts of aliphatic carboxylic acids, aromatic carboxylic acids, thiocarbonyl compounds having a mercapto group or α-hydrogen, and imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid. In general, however, silver salts are less stable as they have a smaller number of carbon atoms, and hence those having an appropriate number of carbon toms (as exemplified by those having 16 to 26 carbon atoms) are preferred.

The aromatic carboxylic acids include benzoic acid derivatives, quinolinic acid derivatives, naphthalenecarboxylic acid derivatives, salicylic acid derivatives. gallic acid, tannic acid, phthalic acid, phenylacetic acid derivatives, and pyromellitic acid.

The compounds having a mercapto or thiocarbonyl group include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atom number of 12 to 23), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication JP-B 44-30271 or JP-B 42-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Laid-Open Patent Application JP-A 58-118638, sulfobenzotriazole, carboxybenxotriazole or salts thereof, or hydroxybenzotriazole, described in Japanese Laid-Open Patent Application JP-A 58-118639, 1,2,4-triazole, described in U.S. Pat. No. 4,220,709, or 1H-tetrazole, carbazole, saccharin, imidazole, and derivatives thereof.

The reducing agent that is converted into the light-absorbing organic compound through oxidation-reduction includes, for example, the compound represented by the following Formula (I):

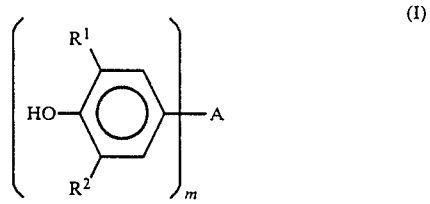

(I)

In the above Formula (I), $R^1$ and $R^2$ each independently represent a hydrogen atom, a hydroxyl group, a halogen atom, a substituted or unsubstituted alkyl group, a substituted or unsubstituted alkenyl group, a substituted or unsubstituted alkynyl group, a substituted or unsubstituted cycloalkyl group, a substituted or unsubstituted aralkyl group, an alkoxy group, or a substituted or unsubstituted amino group; m represents an integer of 1 to 3; and A is a monovalent, divalent or trivalent group and represents a substituted or unsubstituted aralkyl group, a substituted or unsubstituted alkyl group, a substituted amino group, a divalent alkylidene group, a divalent aralkylidene group, or a trivalent methine group.

In the above Formula (I), the unsubstituted alkyl group represented by $R^1$ and $R^2$ may preferably be a straight-chain or branched alkyl having 1 to 18 carbon atoms, as exemplified by methyl, ethyl, propyl, i-propyl, butyl, t-butyl, i-butyl, amyl, i-amyl, sec-amyl, hexyl, 1,1,2,2-tetramethylethyl (hereinafter called "texyl"), heptyl, octyl, nonyl, dodecyl, and stearyl.

Preferred examples of the substituted alkyl group represented by $R^1$ and $R^2$ may include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms.

For example, the alkoxyalkyl group includes methoxyethyl, ethoxymethyl, ethoxyethyl, ethoxypropyl, ethoxybutyl, propoxymethyl, propoxybutyl, i-propoxypentyl, t-butoxyethyl, and hexyloxybutyl.

The halogenoalkyl group includes, for example, chloromethyl, chloroethyl, bromoethyl, chloropropyl, chlorobutyl, chlorohexyl, and chlorooctyl.

The hydroxyalkyl group includes, for example, hydroxymethyl, hydroxyethyl, hydroxypropyl, hydroxybutyl, hydroxypentyl, hydroxyhexyl, and hydroxyheptyl.

The aminoalkyl group includes, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl, and morpholinobutyl.

The alkenyl group represented by $R^1$ and $R^2$ includes, for example, vinyl, allyl, propenyl, butenyl, pentenyl, hexenyl, heptenyl, and octenyl.

The alkynyl group includes, for example, acetylenyl, propynyl, butynyl, pentynyl, hexynyl, heptynyl, and octynyl.

The cycloalkyl group includes, for example, cyclopentyl, cyclohexyl, and cycloheptyl.

The aralkyl group represented by $R^1$ and $R^2$ includes, for example, benzyl, phenetyl, and tolylmethyl.

The amino group represented by $R^1$ and $R^2$ include, for example, acetylamino, diemthylamino, diethylamino, and amino.

The alkoxyl group represented by $R^1$ and $R^2$ includes, for example, methoxy, ethoxy, and propoxy.

Of the above, the substituents preferred as $R^2$ are a chlorine atom, a bromine atom, methyl, ethyl, i-propyl, t-butyl, sec-amyl, texyl, ethoxymethyl, ethoxyethyl, chloromethyl, hydroxymethyl, aminomethyl, dimethylaminomethyl, and benzyl. The substituents preferred as $R^1$ are a chlorine atom, methyl, ethyl, i-propyl t-butyl, amyl, texyl, hydroxyl, chloromethyl, hydroxymethyl, benzyl, and cyclohexyl.

As A, the monovalent, substituted or unsubstituted aralkyl group includes, for example, benzyl, p-methoxybenzyl, p-N,N-dimethylaminobenzyl, p-pyrrolidinobenzyl, p-methylbenzyl, p-hydroxybenzyl, p-chlorobenzyl, 3,5-dichloro-4-hydroxybenzyl, 3-methyl-5-t-butyl-4-hydroxybenzyl, o,p-dimethylbenzyl, 3,5-dimethyl-4-hydroxybenzyl, 2-hydroxy-3-t-butyl-5-methylbenzyl, and naphthylmethyl.

The monovalent, substituted or unsubstituted alkyl group includes, for example, methyl, ethyl, i-propyl, N,N-dimethylaminomethyl, N-benzylaminomethyl, methoxymethyl, ethoxymethyl, hydroxymethyl, methoxycarbonylethyl, methoxycarbonylmethyl, ethoxycarbonylethyl, and diethyl phosphonatomethyl.

The monovalent, substituted amino group includes, for example, methylamino, dimethylamino, diethylamino, acetylamino, phenylamino, diphenylamino, and triazinylamino.

The divalent alkylidene group includes, for example, methylene, ethylidene, propylidene, and butylidene.

The divalent aralkylidene group includes, for example benzylidene, p-methylbenzylidene, and p-dimethylaminobenzylidene.

Of the above, preferred groups as A are a monovalent aralkyl group, a divalent alkylidene group or aralkylidene group, and a trivalent methine group. Particularly preferred groups are a monovalent aralkyl group and a divalent alkylidene group.

Of the reducing agents represented by Formula (I), examples of preferred reducing agents are set out below, but they are not exhaustive.

They include 2,4-dimethyl-6-t-butylphenol, 2-methyl-4-i-propyl-6-t-butylphenol, 2,6-di-t-butyl-4-dimethylaminophenol, 2,6-di-t-butyl-4-hydroxymethylphenol, 2-t-butyl-6-benzyl-4-methylphenol, 2,6-di-t-butyl-4-o-tolylmethylphenol, 2,6di-t-butyl-4-benzylphenol, 2-t-butyl-4-(p-methoxybenzyl)-5-methylphenol, 2,6-dimethyl-4-(α-naphthylmethyl)phenol, 2,6-di-t-butyl-4-(2-hydroxy-3-t-butyl-5-methylbenzyl)-phenol, 2-t-butyl-4-(p-chlorobenzyl)-6-cyclohexyl-phenol, 2-t-butyl-4-(2-hydroxy-3,5-dimethylbenzyl)-5-methylphenol, 2-t-butyl-4-benzyl-6-propargylphenol, 2,6-di-t-butyl-4-(3,5-dimethyl-4-hydroxybenzyl)phenol, 2,6-di-t-butyl-4-(3,5-dimethyl-4-hydroxybenzyl)phenol, 2,6-ditexyl-4-(4-hydroxybenzyl)phenol, 2-texyl-4-benzyl-5-methylphenol, 2-allyl-4-benzyl-5-methylphenol, 2-texyl-4-(p-chlorobenzyl)-5-allylphenol, 2-chloro-4-dimethylaminomethylphenol, 2,6-di-i-propyl-4-diethylaminophenol, 2-t-butyl-4-(2-hydroxy-3-t-butyl-5-methylbenzyl)phenol, 4,4'-methylenebis(2,6-di-t-butylphenol), 4,4'-methylenebis(2-t-butyl-5-methylphenol), 4,4'-methylenebis(2-t-butyl-6-methylphenol), 4,4'-methylenebis(2-texyl-6-methylphenol), 4,4'-methylenebis(2-cyclohexyl-6-methylphenol), 4,4'-methylenebis(2-cyclohexyl-6-t-butylphenol), 4,4'-ethylidenebis(2-6-di-t-butylphenol), 4,4'ethylidenebis(2-t-butyl-6-methylphenol), 4,4'-ethylidenebis(2-cyclohexy-6-methylphenol), 4,4'-ethylidenebis(2-texyl-6-methylphenol), 4,4'-propylidenebis(2,6-di-t-butylphenol), 4,4'-butylidenebis(2-t-butyl-6-methylphenol), 4,4'-butylidenebis(2-texyl-6-methylphenol), 4,4'-butylidenebis(2-cyclohexyl-6-methylphenol), bis(3,5-di-t-buytl-4-hydroxyphenyl)phenylmethane, bis(3,5-di-t-buytl-4-hydroxyphenyl)(4-methoxyphenyl)methane, bis(3,5-di-t-buytl-4-hydroxyphenyl)(4-dimethoxyphenyl)methane, tris(3,5-di-t-buytl-4-hydroxyphenyl)methane, and bis(3-t-buytl-4-hydroxy-5-methylphenyl)phenylmethane.

Of these, particularly preferred reducing agents are 2,6-di-t-butyl-4-o-tolyltrimethylphenol, 2,6-di-t-butyl-4-benzylphenol, 2,6-di-t-butyl-4-(2-hydroxy-3-t-butyl-5-methylbenzyl)phenol, 2,6-di-t-butyl-4-(3,5-dichloro-4-hydroxybenzyl)phenol, 2-t-butyl-4-(2-hydroxy-3,5-dimethylbenzyl)-5-methylphenol, 4,4'-methylenebis(2,6-di-t-butylphenol, 4,4'-methylenebis(2-t-butyl-5-methylphenol), 4,4'-methylenebis(2-t-butyl-6-methylphenol), 4,4'-ethylidenebis(2-6-di-t-butylphenol), 4,4'-ethylidenebis(2-t-butyl-6-methylphenol), 4,4'-propylidenebis(2,6-di-t-butylphenol), 4,4'-butylidenebis(2-cyclohexyl-6-methylphenol), bis(3,5-dit-butyl-4-hydroxyphenyl)phenylmethane, bis)3,5-di-t-butyl-4-hydroxyphenyl)(4-methoxyphenyl)methane, bis(3,5-di-t-butyl-4-hydroxyphenyl)(4-dimethylaminophenyl)methane, and tris(3,5-di-t-butyl-4-hydroxyphenyl)methane.

As the reducing agent that is converted into the light-absorbing organic compound through oxidation-reduction, the compound represented by the following Formula (II) can also be used in the photosensitive member of the present invention.

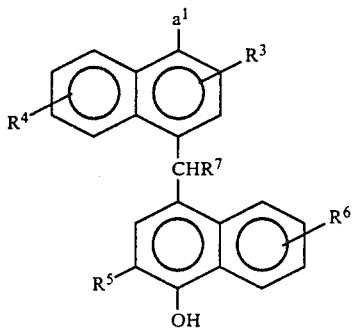

(II)

In the above formula (II), $R^5$ represents a hydrogen atom, an alkyl group, a cycloalkyl group, or an aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group, and $a^1$ represents a hydrogen atom, a hydroxyl group, a halogen atom, a substituted or unsubstituted alkyl group, a cycloalkyl group, an alkoxyl group, or a substituted or unsubstituted amino group.

The halogen atom represented by $a^1$, $R^3$, $R^4$ and $R^6$ in the above Formula (II) includes a fluorine atom, a chlorine atom, a bromine atom, and an iodine atom.

The alkyl group represented by $a^1$, $R^3$, $R^4$, $R^5$, $R^6$ and $R^7$ may preferably be a substituted or unsubstituted straight-chain or branched alkyl group having 1 to 18 carbon atoms, including, for example, a straight-chain or branched hydrocarbon group such as methyl, ethyl, propyl, i-propyl, butyl, t-butyl, amyl, i-amyl, hexyl, texyl, heptyl, octyl, nonyl, dodecyl, or stearyl; a straight-chain or branched alkoxyalkyl group such as methoxyethyl, ethoxyethyl, ethoxypropyl, ethoxybutyl, propoxybutyl, i-propoxypentyl, t-butoxyethyl, or hexyloxybutyl; a hydroxyalkyl group such as hydroxymethyl, hydroxyethyl, hydroxypropyl, hydroxybutyl, hydroxyhexyl, or hydroxyheptyl; an aminoalkyl or alkylaminoalkyl group such as aminomethyl, dimethylaminomethyl, aminoethyl, dimethylaminoethyl, diethylaminoethyl, morpholinoethyl, piperidinoethyl, aminopropyl, diethylaminopropyl, dipropylaminoethyl, aminobutyl, or morpholinobutyl.

The cycloalkyl group represented by $a^1$, $R^3$ and $R^5$ may preferably be a substituted or unsubstituted cycloalkyl group having 5 to 18 carbon atoms, including, for example, cyclopentyl, cyclohexyl, cycloheptyl, cyclooctyl, methylcyclohexyl, dimethylcyclohexyl, and ethylcyclohexyl.

The amino group represented by $a^1$, $R^3$, $R^4$ and $R^6$ may preferably be a substituted or unsubstituted cycloalkyl group having 5 to 18 carbon atoms, including, for example, cyclopentyl, cyclohexyl, cycloheptyl, cyclooctyl, methylcyclohexyl, dimethylcyclohexyl, and ethylcyclohexyl.

The amino group represented by $a^1$, $R^3$, $R^4$ and $R^6$ may preferably be a substituted or unsubstituted amino group, including, for example, amino, acetylamino, methylamino, dimethylamino, diethylamino, pyrrolidino, morpholino, benzenesulfonamide, toluenesulfonamide, dipropylamino, and dibutylamino.

The aryl group represented by $R^3$, $R^4$, $R^6$ and $R^7$ may preferably be a substituted or unsubstituted aryl group having 6 to 16 carbon atoms, including, for example, phenyl, naphthyl, anthryl, phenanthryl, tolyl, xylyl, cumenyl, mesityl, chlorophenyl, methoxyphenyl, and fluorophenyl.

The alkoxy group represented by $R^3$, $R^4$, $R^6$, $R^7$ and $a^1$, may preferably be a substituted or unsubstituted alkoxyl group having 1 to 18 carbon atoms, including, for example, methoxy, ethoxy, propoxy, i-propoxy, and butoxy.

The aralkyl group represented by $R^3$, $R^4$, $R^5$, $R^6$ and $R^7$ may preferably be a substituted or unsubstituted aralkyl group having 7 to 19 carbon atoms, including, for example, benzyl, phenetyl, benzhydryl, trityl, phenylpropyl, naphthylmethyl, chlorobenzyl, dichlorobenzyl, methoxybenzyl, and methylbenzyl.

the acyl group represented by $R^3$, $R^4$ and $R^6$ includes acetyl and propionyl.

Examples of the compound represented by Formula (II) having the above substituent include 4,4'-methylenebis(2-methyl-1-naphthol), 4,4'-methylenebis(2-ethyl-1-naphthol), 4,4'-methylenebis(2-t-butyl-1-naphthol), 4,4'-methylenebis(2cyclohexyl-1-naphthol), 4,4'-methylenebis(2-t-butyl-6-methyl-1-naphthol), 4,4'-methylenebis(2,6-diethyl-1-naphthol), 4,4'-methylenebis(2-1-naphthol), 4,4'-methylenebis(2-t-butyl-8-methyl-1-naphthol), 4,4'-methylenebis(2-methyl-5-chloro-1-naphthol), 4,4'-methylenebis(2-methyl-8-dimethylamino-1-naphthol), 4,4'-methylenebis(2-methyl-5-benzyl-1-naphthol), 4,4'-methylenebis(2-methyl-5-methoxy-1-naphthol), 4,4'-methylenebis(2-methyl-5-phenyl-1-naphthol), 4-(3'-cyclohexyl-4'-hydroxynaphthyl)methyl-2-methyl-1-naphthol, 4-(3'-t-butyl-4'-hydroxynaphthyl)methyl-2-methyl-1-naphthol, 4-(3'cyclohexyl-4'-hydroxynaphthyl)methyl-2-t-butyl-1-naphthol, 4,4'-benzylidenebis(2-methyl-1-naphthol), 4,4'-benzylidenebis(2-t-butyl-1-naphthol), 4,4'-ethylidenebis(2methyl-1-naphthol), 4,4'-ethylidenebis-(2-t-butyl-1-naphthol), and bis(4-hydroxy-3-methylnaphthyl)tolylmethane.

As another reducing agent that is converted into the light-absorbing organic compound through oxidation-reduction, the compound represented by the following Formula (III) can also be used in the photosensitive member of the present invention.

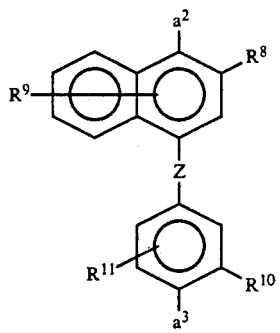

(III)

In the above Formula (III), $R^8$, $R^9$, $R^{10}$ and $R^{11}$ each independently represent a substituent selected from the group consisting of a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, and an acyl group; Z represents a divalent group; and $a^2$ and $a^3$ each represent a substituent selected from the group consisting of a hydrogen atom, a hydroxyl group, a halogen atom, a substituted or unsubstituted alkyl group, a cycloalkyl group, an alkoxyl group, and a substituted or unsubstituted amino group provided that at least one of $a^2$ and $a^3$ is a hydroxyl group.

The halogen tom represented by $R^8$, $R^9$, $R^{10}$, $R^{11}$, $a^2$ and $a^3$ includes a fluorine atom, a chlorine atom, a bromine atom, and an iodine atom.

The alkyl group represented by $R^8$, $R^9$, $R^{10}$, $R^{11}$, $a^2$ and $a^3$ may preferably be a straight-chain or branched alkyl group having 1 to 18 carbon atoms, including, for example, methyl, ethyl, propyl, i-propyl, butyl, t-butyl, i-butyl, amyl, i-amyl, sec-amyl, hexyl, texyl, heptyl, octyl, nonyl, dodecyl, and stearyl. The substituted alkyl group may preferably include an alkoxyalkyl group having 2 to 18 carbon atoms; a halogenoalkyl group having 1 to 18 carbon atoms, and an aminoalkyl group having 1 to 18 carbon atoms, specifically including, for example, methoxyethyl, ethoxyethyl, ethoxypropyl, ethoxybutyl propoxybutyl, i-propoxypentyl, t-butoxyethyl, hexyloxybutyl, chloromethyl, chloroethyl, bromoethyl, chloropropyl, chlorobutyl, chlorohexyl, chlorooctyl, hydroxymethyl, hydroxyethyl, hydroxypropyl, hydroxybutyl, hydroxypentyl, hydroxyhexyl, hydroxyheptyl, aminomethyl, acetylaminoethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, aminopropyl, acetylaminopropyl, aminobutyl, and morpholinobutyl.

The aryl group represented by $R^8$, $R^9$, $R^{10}$ and $R^{11}$ includes, for example, phenyl, naphthyl, anthryl, and phenanthryl. The substituted aryl group includes, for example, tolyl, xylyl, cumenyl, mesityl, chlorophenyl, methoxyphenyl, and fluorophenyl.

The aralkyl group represented by $R^8$, $R^9$, $R^{10}$ and $R^{11}$ includes, for example, benzyl, phenethyl, benzhydryl, trityl, phenylpropyl, and naphthylmethyl. The substituted aralkyl group includes, for example, chlorobenzyl, dichlorobenzyl, methoxybenzyl, and methylbenzyl.

The cycloalkyl group represented by $R^8$, $R^9$, $R^{10}$, $R^{11}$, $a^2$ and $a^3$ includes, for example, a cycloalkyl group with a ring of 5, 6 or 7 members, which may have a substituent of an alkyl group, The alkoxyl group represented by $R^8$, $R^9$, $R^{10}$, $R^{11}$, $a^2$ and $a^3$ includes, for example, methoxy, ethoxy, propoxy, butoxy, i-propoxy, benzyloxy, and 2-phenylethoxy.

The substituted or unsubstituted amino group represented by $a^2$ and $a^3$ includes, for example, amino, acetylamino, methylamino, isopropylamino, dimethylamino, phenylamino, diethylamino, cyclopentylamino, cyclopentylmethylamino, cyclohexylamino, piperidino, and pyrrolidino.

Z represents a divalent group, and is exemplified by an alkylene group and an aralkylene group. Specifically, it preferably includes methylene, ethylidene, propylidene, benzylidene, cinnamylidene, p-hydroxybenzylidene, p-methylbenzylidene, and p-dimethylaminobenzylidene.

Of the compound represented by the above Formula (III), examples of particularly preferred compounds are set out below.

Examples of the compound represented by Formula (III) include 2-methyl-4-(3,5-dimethyl-4-hydroxyphenyl)methyl-1-naphthol, 2-methyl-4-(3,5-di-t-butyl-4-hydroxyphenyl)methyl-1-naphthol, 2-methyl-4-hydroxyphenyl)methyl-1-naphthol, 2-methyl-4-p-tolylmethyl-1-naphthol, 2-methyl-4-benzyl-1-naphthol, 2-t-butyl-4-(4-hydroxyphenyl)methyl-1-naphthol, 2-methyl-4-(3,5-dichloro-4-hydroxypheny)methyl-1-naphthol, 2-ethyl-4-(3,5-di-t-butyl-4-hydroxyphenyl)methyl-1-naphthol, 2-methyl-4-(3,5-dimethyl-4-hydroxyphenyl)methyl-1-naphthol, 2-methyl-4-(3-methyl-4-hydroxyphenyl)-methyl-1-naphthol, 2-t-butyl-4-(3-t-butyl-4-hydroxyphenyl)methyl-1-naphthol, 2,6-di-t-butyl-4-α-naphthylmethylphenol, 2-6-di-t-butyl-4-methoxynaphthylmethylphenol, 2-methyl-4-(3-chloro-4-hydroxyphenyl)-methyl-1-naphthol, 2-methyl-4-(4-dimethylaminophenyl)methyl-1-naphthol, 2-ethyl-4-dimethylaminophenyl-1-naphthol, 2-methyl-4-cyclohexyl-4-hydroxyphenyl)methyl-1-naphthol, 2-methyl-4-(3-phenyl-4-hydroxyphenyl)methyl-1-naphthol, 2-methyl-4-(3-t-butyl-4-hydroxy-5-methylphenyl)methyl-1-naphthol, and 2-methyl-4-benzyl-6-methyl-1-naphthol.

Of the above reducing agents of Formulas (I), (II) and (III), it is possible to use two or more species in combination.

In addition to the above reducing agents, leuco compounds of reducible dyes can be used as the reducing agent that is converted into the light-absorbing organic compound. Preferred leuco compounds include those of, for example, azo dyes, azomethine dyes, triarylmethane dyes, xanthene dyes, azine dyes, indigoid dyes, formazan dyes, nitro dyes, nitroso dyes, and azoxy dyes. Particularly preferred are leuco compounds of azomethine dyes, triarylmethane dyes, xanthene dyes, azine dyes, and indigoid dyes. To further improve the stability of these leuco compounds, they can also be used in the form in which the hydroxyl group or amino group has been acylated or sulfonated. Preferred examples of the leuco compounds include, for example, α-benzoyl-α-(p-diethylaminoanilino)-acetanilide, α-benzoyl-α-(p-diethylamino-o-methyl-anilino)aceto-o-chloroanilide, α-benzoyl-α-(p-dimethylaminoanilino)aceto-o-methoxyanilide, Crystal Violet Hydrol, 9-phenyl-2,7-dichloro-3,6-dihydroxyxanthene, 9-phenyl-2,4,5,7-tetrachloro-3,6-dihydroxyxanthene, 9-phenyl-4,5-dimethyl-3,6-dihydroxyxanthene, and 9-phenyl-3-diethylamino-6-hydroxy-7-chloroxanthene.

The reducing agent forming an oxidation product through oxidation-reduction, which is further reacted with a coupler to produce the light-absorbing organic compound, may include, for example, secondary color developing agents. Preferred secondary color developing agents include, for example, p-aminophenols, p-phenylenediamines, and o-aminophenols.

Also usable as the secondary color developing agent are hydrazines as disclosed in Japanese Laid-Open Patent Application JP-A 56-27132, sulfonamidophenols as disclosed in U.S. Pat. No. 4,021,240, and also a compound capable of producing an aromatic primary amine on heating, as disclosed in Japanese Laid-Open Patent Application JP-A 59-53831. Examples of the secondary color developing agent that can be preferably used in the present invention include 4-amino-N,N-diethylaniline, 2-amino-5-diethylaminotoluene, 4-amino-N,N-diethyl-3-($\beta$-hydroxyethyl)aniline, 4-amino-N,N-bis($\beta$-hydroxyethyl)-3-methylaniline, p-aminophenol, p-amino-o-cresol, o-aminophenol, and o-amino-p-cresol. These may be used as they are, or may be used in the form of salts such as a hydrochloride, a sulfate, a phosphate, a p-toluenesulfonate, a benzenesulfonate, and a naphthalenedisulfonate.

The coupler may preferably include $\alpha$-acylacetamide, pyrazolones, phenols, and naphthols. These are described in "SHASHIN NO KAGAKU (Chemistry of Photography)", First Edition, Shashin Kogyo Shuppansha, pp. 278-282, or T. H. James, "The Theory of the Photographic Process", Fourth Edition, Macmillan Publishing Co., Inc. pp. 353-361.

Examples of the coupler include benzoylacetanilide, benzoylaceto-o-methoxyanilide, benzoylaceto-o-chloroanilide, 1-phenyl-3-(4'-nitrobenzamide)-5-pyrazolone, 1-phenyl-3-[m-(p-t-amylphenoxy)benzamide]-5-pyrazolone, 2-chloro-1-naphthol, and 5-isopropyl-o-cresol. Indazolones or cyanoacetyls can also be used as the coupler.

A reducing agent that is not converted into a light-absorbing organic compound as a result of oxidation-reduction may also be contained in the photosensitive member of the present invention so long as the object of the present invention may not be hindered. Such a reducing agent may include, for example, phenols, hydroquinones, catechols, p-aminophenols, 3-pyrazolidones, resorcins, pyrogallols, m-aminophenols, m-phenylenediamines, 5-pyrazolones, alkylphenols, alkoxyphenols, naphthols, aminonaphthols, naphthalenediols, alkoxynaphthols, hydrazines, hydrazones, hydroxycoumarones, hydroxycoumarans, sulfonamide phenols, aminonaphtols, ascorbic acids, hydroxyindanes, and orthobisphenols. Leuco bases obtained by reduction of dyes can also be used as the reducing agent.

Next, explanation will be made on the heat-diffusive colorant, the polymerizable polymer precursor and the photopolymerization initiator contained in the particles.

The heat-diffusive colorant used in the present invention includes a heat-diffusive dye and also a heat-diffusive substance which presents a color when it reacts with a developer after heat or thermal diffusion. More specifically, the heat-diffusive colorant includes, for example, monoazo dyes, thiazole dyes, anthraquinone dyes, triallylmethane dyes, rhodamine dyes, naphthol dyes, triarylmethane dyes, fluoran dyes and phthalide dyes.

The heat-diffusive colorant, in general, has a larger heat-diffusivity (i.e., ability of being diffused on heating) as the molecular weight becomes smaller, and also has a smaller heat-diffusivity as the dye has more polar groups as exemplified by a carboxyl group, an amino group, a hydroxyl group, a nitro group and a sulfone group. Hence, colorants having the desired heat-diffusivity may be appropriately selected on the basis of the molecular weight and polar groups, depending on the degree of polymerization or crosslinking density and heating conditions in the photosensitive member of the present invention.

In the case where the heat-diffusive colorant is a substance, such as a leuco dye, which presents a color when it reacts with a developer after heat diffusion, such a developer as zinc oxide, calcium sulfate, novolak-type phenolic resin, zinc 3,5-dimethyl-tert-butylsalicylate, etc., may be contained in the image-receiving member.

In other words, the heat-diffusive colorant may be colored per se or may be colorless if it reacts with the developer in the image-receiving member to form a color.

The polymerizable polymer precursor may be a compound having at least one reactive vinyl group in its molecule.

The reactive vinyl group in these compounds includes substituted or unsubstituted vinyl groups having polymerization reactivity, as exemplified by styrene type vinyl groups, acrylic acid type vinyl groups, methacrylic acid type vinyl groups, allyl type vinyl groups, and vinyl ether type vinyl groups, as well as ester vinyl groups as in vinyl acetate.

Examples of the polymerizable polymer precursor satisfying such conditions are as follows.

They include, for example;

monofunctional monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, $\beta$-chloroethyl vinyl ether, phenyl vinyl ether, p-methylphenyl vinyl ether, and p-chlorophenyl vinyl ether;

difunctional monomers such as divinylbenzene, distyryl oxalate, distyryl malonate, distyryl succinate, distyryl glutarate, distyryl adipate, distyryl maleate, distyryl fumarate, distyryl $\beta,\beta'$-dimethylglutarate, distyryl 2-bromoglutarate, distyryl $\alpha\alpha'$-dichloroglutarate, distyryl terephthalate, oxalic acid di(ethyl acrylate), oxalic acid di(methyl ethyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(diethyl acrylate), fumaric acid di(ethyl acrylate), $\beta,\beta'$-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), $\beta,\beta'$-dimethylglutaric acid di(ethyl methacrylate), 1,4-phenylenebis(oxyethyl methacrylate), and 1,4-bis(methacryloyloxyethoxy)-cyclohexane acryloyloxyethoxyethyl vinyl ether;

trifunctional monomers such as pentaerythritol triacrylate, pentaerythritol trimethacrylate, pentaerythritol tri(hydroxystyrene), cyanuric acid triacrylate, cyarnuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethylacrylate), dipentaerythritol hexaacrylate, cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product pattern 1,1,1-trimethylolpropane and three-fold moles of hexanediisocyanate, with p-hydroxystyrene; and tetrafunctional monomers such as ethylenetetraacrylamide, and propylenetetraacrylamide. Two or more of these polymerizable polymer precursors can be used in combination.

The photopolymerization initiator used in the photosensitive member of the present invention includes, for example, carbonyl compounds, sulfur compounds, halogen compounds, photopolymerization initiators of redox type, and peroxide initiators sensitized with dye such as pyrilium.

Specifically, the carbonyl compounds include diketones as exemplified by phenyl, 4,4'-dimethoxybenzyl, diacetyl, and camphorquinone; benzophenones as exemplified by 4,4'-bis(diethylamino)benzophenone, and 4,4'-dimethoxybenzophenone; acetophenones as exemplified by acetophenone, and 4-methoxyacetophenone; benzoin alkyl ethers; thioxanthones as exemplified by 2-chlorothioxanthone, 2,4-dichlorothixanthone, 2,4-diethylthioxanthone, and thioxanthone-3-carboxylic acid-$\beta$-methoxy ethyl ester; chalcones and styrylketones having a dialkylamino group; and cumarins as exemlified by 3,3'-carbonylbis(7-methoxycumarin), and 3,3'-carbonylbis(7-diethylaminocumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction.

Such combination of the photopolymerization initiators includes a combination of styryl nketones or chalcones having a dialkylamino group or cumarins, with S-triazines having a trihalomethyl group or camphorquinone.

In the photosensitive member of the present invention, a photopolymerization initiator having a photosensitive wavelength region of from 370–520 nm may preferably be used.

In the present invention, the photopolymerization initiator to be used is required to be appropriately selected depending on the light-absorption characteristics of the light-absorbing organic compound produced as a result of the oxidation-reduction of the reducing agent. Examples of such combination of the reducing agent and photopolymerization initiator are set out below.

When, for example, 4,4'-propylidenebis(2,6-di-t-butylphenol), 4,4'-butylidenebis(3-methyl-6-t-butylphenol), 4,4'-methylenebis(2,6-di-t-butylphenol), 4,4'-methylenebis(2-t-b , 2,6-di-t-butyl-4-(3,5-dimethyl-4-hydroxyphenyl)methylphenol, 2-methyl-4-(3,5-dimethyl-4-hydroxyphenyl)methyl-1naphthol, etc. are used as the reducing agent, photopolymerization initiators having sensitivity at 380 mm to 420 mm may be preferred, as exemplified by 2-chlorothioxanthone, 2-methylthioxanthone, 2,4-dimethylthioxanthone, 2,4-diethylthioxanthone, 3,3'carbonylbis(7-methoxycumarine), 2,4,6-trimethyl-benzoyldiphenyl-phosphine oxide, and benzyl.

When, for example, 2,6-di-t-butyl-4-(2-hydroxy-3-t-butyl-5-methylbenzyl)phenol, 2,6-di-t-butyl-4-benzylphenol, 2,6-di-t-butyl-4-o-trimethylphenol, etc. are used as the reducing agent, photopolymerization initiators having sensitivity at 300 mm to 380 mm may be preferred as exemplified by 1-phenyl-2-hydroxy-2-methylpropane-1-one, 1-hydroxycyclohexyl phenyl ketone, benzyl dimethyl ketal, benzophenone, and 4-benzoyl-4'-methyl-diphenyl sulfide.

When, for example, bis(3,5-di-t-butyl-4-hydroxyphenyl)-(4-dimethylaminophenyl)methane, 4,4'methylenebis(2-methyl-1-naphthol), 4,4'-methylenebis(2-ethyl-1-naphthol), 4,4'-methylenebis(2-cyclohexyl-1naphthol), 4,4'-methylenebis(2-t-butyl- 1-naphthol), etc. are used as the reducing agent, it is preferred to use a combination of a photopolymerization initiator having sensitivity at 400 mm to 520 mm, as exemplified by 3,3'-carbonylbis(7-dimethylaminocumarine), riboflavin tetrabutylate, or merocyanine dyes, with a trichloromethyl-S-triazine compound.

In the present invention, it is further preferred to incorporate a chain transfer agent in the particles. The chain transfer agent may for example be a thiol compound, a halogen compound or an amine compound.

If a chain transfer agent of a thiol compound is copresent with an organic silver salt, the resultant image is liable to be accompanied with color fog. Alternatively, if a chain transfer agent of a halogen compound is copresent with an organic silver salt, the organic silver salts turns into a silver halide with lapse of time so that the oxidation-reduction in the above-mentioned step (b) does not readily proceed, thus being liable to result in polymerization image with an insufficient contrast. In the present invention, however, if a chain transfer agent is contained in the particles and the content of an organic silver salt in the particles is made zero or a small amount free from problem, various effects, such as improvement in stability with time, improvements in sensitivity at the time of polymerization exposure and crosslinking density and prevention of color fog at highlight portions, can be attained without accompanying the above problems. Accordingly, it constitutes a very preferred embodiment of the present invention to incorporate a chain transfer agent in the particles.

Preferred examples of the thiol compound as a chain transfer agent may include aromatic thiols, such as 2-mercaptobenzothiazole, 2-mercapto-5-methylthiazole, 2-mercapto-5-ethylbenzothiazole, 2-mercaptobenzimidazole, and p-mercaptotoluene. Examples of the halogen compound may include: carbon tetrabromide, tribromomethane, dibromomethane, trichlorobromomethane, tetralfuorodibromoethane, N-bromosuccimide, 2,4,6-tribromophenol, 1,3,5-trichloromethyl-1,3,5-triazine. Examples of the amine compound may include diethanolamine, triethanolamine, diethanolaniline, p-dimethylaminobenzene, p-diethylaminocyanobenzene, methyl p-dimethylaminobenzoate, ethyl p-dimethylaminobenzoate, and ethyl p-diethylaminobenzoate.

The particles 4 and 5 may desirably have a particle size of 0.01–20 microns, preferably 0.1–5 microns. Further to say, it is preferred in respect of resolution that the particles 5 in the photosensitive layer 7 which is closer to the image-receiving member 6 at the time of transfer have a particle size which is smaller than that of the particles 4 in the photosensitive layer 6 which is farther from the image-receiving member 6. The particles 4 and 5 may be in the form of microcapsules of which the cores comprise the above-mentioned polymerizable polymer precursor, photopolymerization initiator and heat-diffusive colorant or alternatively may be in the form of simple particles of a composition comprising the above-mentioned polymerizable polymer precursor, photopolymerization initiator and heat-diffusive colorant which particles are dispersed in the matrix phase. Further, the particles 4 and 5 can assume a multi-layered structure in which the heat-diffusive colorant is coated with a composition comprising the polymerizable polymer precursor and photopolymerization initiator or can be in the form of microcapsules including cores having the above-mentioned multi-layered structure.

The respective components in the photosensitive layer 6 and in the photosensitive layer 7 may be the same or different components which may be appropriately selected depending on various conditions with proviso that the particles 5 and 4 contain heat-diffusive colorants presenting different colors. Further, in view of easiness of forming a desired multi-color image, it is preferred that the matrix phase 2 and the matrix phase 3 have different photosensitive wavelength regions. The difference in photosensitivity can be provided by any components as far as it is suitable for multi-color image formation. It is however generally preferred that the respective photosensitive layers contain different species of photosensitive silver salts and/or photosensitive silver salts sensitized to different wavelength regions.

The matrix phases 2 and 3 can contain a polymerizable polymer precursor and a photopolymerization initiator within an extent not impairing the object of the present invention. In such a case, the matrix phases 2 and 3 and the particles 4 and 5 can contain different polymerizable polymer precursors, different photopolymerization initiators and/or different compositions of these components. In case where the particles 4 and 5 contain a polymerizable polymer precursor of a low molecular weight as a principal constituent, the particles 4 and 5 can be liquid and assume a so-called oil droplet. However, the particles 4 and 5 need not be liquid but can be solid.

It is further possible to dispose a filter layer for masking a light to which the matrix phase 2 is sensitive between the photosensitive layers 6 and 7. In this case, the filter layer 4 is required to be one through which the heat-diffusive colorant in the particles 4 can be transmitted. The filter layer 4 may preferably be formed from, e.g., a binder having a glass transition temperature which is not higher than the temperature for transferring the heat-diffusive colorant.

The photosensitive member according to the present invention is not required to have only two photosensitive layers. For example, it is a preferred embodiment which comprises three laminated photosensitive layers for presenting three colors of yellow, magenta and cyan, respectively, so as to easily provide a full color image.

In the photosensitive member of the present invention, the matrix phases 2 and 3 can contain a binder so as to provide improved film-forming characteristic and dispersibility. The particles 4 and 5 can also contain a binder.

The binder used for this purpose may include, for example:

cellulose esters such as nitrocellulose, cellulose phosphate, cellulose sulfate, cellulose acetate, cellulose propionate, cellulose butyrate, cellulose myrystate, cellulose palmitate, cellulose acetate propionate, and cellulose acetate butyrate;

cellulose esters such as methyl cellulose, ethyl cellulose, propyl cellulose, and butyl cellulose;

vinyl resins such as polystyrene, polyvinyl chloride, polyvinyl acetate, polyvinyl butyral, polyvinyl acetal, polyvinyl alcohol, and polyvinyl pyrrolidone;

copolymer resins such as a styrene/butadiene copolymer, a styrene/acrylonitrile copolymer, a styrene/butadiene/acrylonitrile copolymer, and a vinyl chloride/vinyl acetate copolymer;

acrylic resins such as polymethyl methacrylate, polymethyl acrylate, polybutyl acrylate, polyacrylic acid, polymethacrylic acid, polyacrylamide, and polyacrylonitrile;

polyesters such as polyethylene terephthalate;

polyarylate resins such as poly(4,4'isopropylidene, diphenylene-co-1,4-cyclohexylenedimethylene carbonate), poly(ethylenedioxy-3,3'phenylene thiocarbonate), poly(4,4'-isopropylidene, isopropylidene, diphenylene carbonate), poly(4,4'-sec-butylidene, diphenylene carbonate), and poly(4,4'isopropylidene, diphenylene carbonate-block-oxyethylene);

plyamides; polyimides; epoxy resins; phenolic resins;

polyolefins such as polyethylene, polypropylene, and chlorinated polyethylene; and natural polymers such as gelatin.

In addition to the above, optional components, such as a color-adjusting agent, a fog-preventing agent, an alkali generating agent, etc., may be incorporated in the matrix phases or the particles, as desired.

In the photosensitive member according to the present invention, the respective components may be used in proportions as described below.

The organic silver salt may preferably be used in a proportion of 0.3–30 $g/m^2$, particularly 0.7–15 $g/m^2$, further preferably 1.2–8 $g/m^2$, for each photosensitive layer. The photosensitive silver salt may preferably be used in a proportion of 0.001–2 moles, particularly 0.05–1 mole, per 1 mole of the organic silver salt. Further, the reducing agent may preferably be used in a proportion of 0.05–3 moles, particularly 0.2–1.3 moles, per 1 mole of the organic silver salt. The coupler, when required, may preferably be used in a proportion of 0.4-3 moles, further preferably 0.7-1.8 moles, particularly preferably 0.8-1.3 moles, per 1 mole of the reducing agent.

In the particles, it is preferred that the polymerizable polymer precursor is contained in a proportion of 10-80 wt. %, particularly 30-70 wt. %. The photopolymerization initiator may preferably be contained in a proportion of 0.1-30 wt. parts, particularly 0.5-10 wt. parts, per 100 wt. parts of the polymerizable polymer precursor. The heat-diffusive colorant my preferably be used in a proportion of 2.5-100 wt. parts, particularly 5-50 wt. parts, per 100 wt. parts of the total of the polymerizable polymer precursor and photopolymerization initiator in the particles. When a chain transfer agent is contained in the particles, it is preferred that the chain transfer agent is used in a proportion of 1-1000 wt. parts, particularly 10-400 wt. parts, per 100 wt. parts of the photopolymerization initiator.

It is further preferred that the photo-polymerization initiator is used in a proportion of 0.01-10 moles, particularly 0.5-3 moles, per 1 mole of the reducing agent.

The particles may preferably be dispersed in a proportion of 10-90 wt. parts, particularly 20-70 wt. parts, per 100 wt. parts of each photosensitive layer of the photosensitive member.

In the matrix phases 2 and 3, the binder may be contained, as desired, in a proportion of 0-10 wt. parts, preferably 0.5-5 wt. parts, per 1 wt. part of the organic silver salt. On the other hand, the particles 4 and 5 can contain a binder in a proportion of 0-10 wt. parts per 1 wt. part of the polymerizable polymer precursor.

The particles contained in the photosensitive layers can be prepared by encapsulating techniques as used hitherto in production of carbonless papers. The encapsulation methods may include those disclosed in, e.g., U.S. Pat. Nos. 2730456 and 2800457, Japanese Patent Publications (KOKOKU) 36-9168, 37-12379, 37-7730 and 43-23909, and Japanese Laid-Open Patent Application (KOKAI) 63-80838, etc. Capsule films may be formed from known resins, such as gelatin, polyurethane, polyurea, urea-formalin, and melamine-formalin. Further, as described before, the particles used in the present invention are not necessarily in the form of capsules prepared in advance but may be particles formed as a disperse phase of a composition comprising at least the heat-diffusive colorant, polymerizable polymer precursor and photopolymerization initiator dispersed in a matrix phase of a composition comprising at least the photosensitive silver salt, organic silver salt and reducing agent. In the case where the particles are formed by direct dispersion, it is preferred that the composition constituting the particles and the composition constituting the matrix phase are not mutually soluble and have different solubilities. More specifically, it is preferred that the composition constituting the particles are not readily soluble in a solvent for applying the matrix phase.

Each photosensitive layer of the photosensitive member according to the present invention may be formed by dissolving or dispersing the above components together with a binder used as desired in a solvent and applying the resultant liquid to a substrate, such as a metal foil, plastic film, paper, baryta paper or synthetic paper, followed by drying, or, when a sufficient strength is given by the binder per se, by incorporating the above essential components in a film or sheet formed by the binder without using a substrate. Each photosensitive layer 6 or 7 may desirably have a thickness of about 0.1 micron-2 mm, preferably about 1 micron-0.1 mm, and the substrate 1 may preferably have a thickness or about 2 microns-3 mm.

Hereinbelow, the present invention will be described more specifically based on Examples wherein "parts" means "parts by weight".

EXAMPLE 1

Preparation of photosensitive liquid A

Preparation of particles A

A solution having the following composition was provided.

| | |
|---|---|
| MS Cyan VP (mfd. by Mitsui Toatsu K.K.) | 2.5 part(s) |
| Polymethylmethacrylate (Mw (molecular weight) = 48 × 10$^4$) | 8.0 part(s) |
| Dipentaerythritol hexaacrylate | 10 part(s) |
| 1,3,5-Tris(trichloromethyl)triazine | 2.8 part(s) |
| 3,3'-Carbonylbis(7-diethylaminocoumarin) | 2.7 part(s) |
| Chloroform | 30 part(s) |

The above solution was encapsulated in the following manner. An aqueous solution containing 2.0 wt. % of isobutylene-maleic anhydride copolymer ("Isoban", mfd. by Kuraray K. K.) and 0.3 wt. % of pectin was acidified with sulfuric acid to a pH of 4.5, and 56 parts of the above-prepared solution was added to 150 parts of the aqueous solution, followed by emulsification by means of a homogenizer rotating at 7000 rpm. After three hours of stirring together with aeration were added 1 part of melamine, 2.5 parts of 50 wt. %-urea aqueous solution and 10 parts of 37%-formalin aqueous solution, followed by 3 hours of reaction at 65° C. Then, the pH of the system was adjusted to pH 9.0 by addition of 20%-NaOH aqueous solution, followed by addition of 0.6 part of sodium bisulfite and 1.1 parts of sodium sulfite and standing for cooling. The resultant capsules had a volume-average particle size of 1.6 microns (as measured in the form of a dispersion of a 1%-NaCl aqueous solution by means of a Coulter counter available from Coulter Electronics, Co. with an aperture diameter of 50 microns). After the filtration, 25 parts of the capsules were dispersed in 40 parts of n-butanol.

Preparation of silver emulsion A

A liquid dispersion having the following composition was prepared by using a homomixer under a safe light.

| | |
|---|---|
| Behenic acid | 2.5 part(s) |
| Palmitic acid | 2.5 part(s) |
| Silver behanate | 4.5 part(s) |
| Silver bromide | 0.7 part(s) |
| Polyvinylbutyral | 10.0 part(s) |
| Trimethylolpropanetriacrylate | 10.0 part(s) |
| Ethyl 4-dimethylaminobenzoate | 0.8 part(s) |
| 3,3'-Carbonylbis(7-diethylaminocoumarin) | 0.7 part(s) |
| 4,4'-Methylenebis(2-methyl-1-naphthol) | 3.2 part(s) |
| Phthaladinone | 0.7 part(s) |
| Xylene | 70 part(s) |
| n-Butanol | 40 part(s) |

To the above dispersion was added a solution of 0.002 part of a compound having the following structural formula in 1 part of N,N-dimethylformamide to complete the preparation of a silver emulsion A.

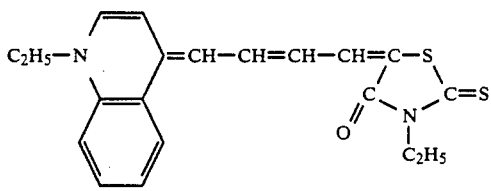

30 parts of the above-prepared dispersion of the particles A was added to 68 parts of the silver emulsion A to prepare a photosensitive liquid A.

Preparation of photosensitive liquid B

Preparation of particles B

A solution having the following composition was provided.

| | |
|---|---|
| MS Magenta VP (mfd. by Mitsui Toatsu K.K.) | 2.5 part(s) |
| Polymethylmethacrylate (Mw (molecular weight) = 48 × 10$^4$) | 8.0 part(s) |
| Dipentaerythritol hexaacrylate | 10 part(s) |
| 2-Mercaptobenzothiazole | 0.4 part(s) |
| Ethyl p-dimethylaminobenzoate | 0.4 part(s) |
| 2,4-diethylthioxanthone | 1.6 part(s) |
| Chloroform | 25 part(s) |

The above solution was treated in the same manner as in preparation of the particles A to prepare a liquid dispersion containing particles having an average particle size of 1.9 microns.

Preparation of silver emulsion B

A liquid dispersion having the following composition was prepared by using a homomixer under a safe light.

| | |
|---|---|
| Behenic acid | 2.5 part(s) |
| Silver behanate | 4.5 part(s) |
| Silver bromide | 0.7 part(s) |
| Polyvinylbutyral | 10.0 part(s) |
| Phthalazinone | 0.7 part(s) |
| 4,4'-Methylenebis(2,6-di-t-butylphenyl) | 3.8 part(s) |
| Xylene | 70 part(s) |
| n-Butanol | 40 part(s) |

To the above dispersion was added a of 0.002 part of a compound having the following structural formula in 1 part of N,N-dimethylformamide to complete the preparation of a silver emulsion B.

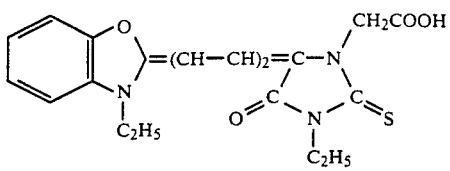

30 parts of the above-prepared dispersion of the particles B was added to 63 parts of the silver emulsion B to prepare a photosensitive liquid B.

Preparation of photosensitive member

A polyethylene terephthalate (PET) film was coated with the photosensitive liquid A so as to provide a dry thickness of 7 microns and then with the photosensitive liquid B so as to provide a dry thickness of 7 microns, whereby a photosensitive member having two photosensitive layers was prepared.

Image formation

The photosensitive member was subjected to imagewise exposure by two LEDs of 810 nm and 660 nm, and then passed through a heater controlled at 115° C. for 30 sec. Then, the photosensitive member was subjected to 20 sec. of whole-area exposure by ultra-high pressure mercury lamp. An image-receiving member having a coating layer of polyester resin was superposed on the photosensitive member, and the superposed body was passed through heat rollers heated at 110° C. for 60 sec. After peeling the photosensitive member, there was left a clear two-color image of cyan and magenta corresponding to the imagewise exposed parts on the image-receiving member.

EXAMPLE 2

Particles C, D and E were separately prepared in the following manner from liquid compositions shown in Composition Table 1 appearing hereinafter.

Thus, a liquid composition shown in Composition Table 1 (in an amount of 80.7 parts for particles C, 81.0 parts for particles D, and 81.8 parts for particles E) was added to a mixture of 80 parts of water, 20 parts of cationically modified colloidal silica and 2 parts of 2N (normal)-hydrochloric acid, followed by emulsification by a homomixer.

The thus-prepared particles C, D and E showed volume-average particle sizes of 1.0 micron, 1.1 microns and 1.1 microns, respectively. Then, these particles were separately recovered by filtration, washed with water, washed with 0.5N-NaOH aqueous solution, washed again with water and then dried.

Separately, silver emulsions C, D and E were respectively prepared from compositions shown in Composition Table 2 below.

Composition TABLE 1

| Particle C | | Particle D | | Particle E | |
|---|---|---|---|---|---|
| 1-methylamino-2-methyl-4-anilino-anthraquinone | 1.8 parts | MS Magenta VP (Mitsui Toatsu K.K.) | 2.0 parts | MS yellow VP (Mitsui Toatsu K.K.) | 2.2 parts |
| polymethyl methacrylate (Mw + 48 × 10$^4$) | 8.0 parts | polymethyl methacrylate (Mw + 48 × 10$^4$) | 8.0 parts | polymethyl methacrylate (Mw + 28 × 10$^4$) | 8.0 parts |
| dipentaerythritol hexaacrylate | 8.0 parts | dipentaerythritol hexaacrylate | 8.0 parts | trimethylolpropane triacrylate | 3.0 parts |
| camphorquinone | 1.0 part | 2,4-dichlorothioxanone | 1.5 parts | dipentaerythritol hexaacrylate | 6.0 parts |
| 1,3,5-tris(trichloromethyl)-triazine | 1.2 parts | ethyl p-dimethylaminobenzoate | 1.5 parts | 2-mercaptobenzothiazole | 0.1 part |
| 3,3'-carbonylbis(7-diethylamino-coumarin) | 0.7 part | | | benzyl dimethyl ketal | 2.5 parts |

Composition TABLE 1-continued

| Particle C | | Particle D | | Particle E | |
|---|---|---|---|---|---|
| methyl ethyl ketone | 60 parts | methyl ethyl ketone | 60 parts | methyl ethyl ketone | 60 parts |

Composition Table 2

| Silver emulsion C | | Silver emulsion D | | Silver emulsion E | |
|---|---|---|---|---|---|
| silver bromide | 0.5 part(s) | ← | | silver halide | 0.7 part(s) |
| behenic acid | 2.0 part(s) | ← | | ← | |
| silver behanate | 4.5 part(s) | ← | | ← | |
| homophthalic acid | 0.5 part(s) | ← | | ← | |
| polyvinyl butyral | 8.0 part(s) | ← | | polyvinyl butyral | 6.0 parts |
| phthaladinone | 0.6 part(s) | ← | | 7-methoxybenzoxazine-2,4-dione | 0.4 part |
| 2-methyl-4-(3,5-dimethyl-4-hydroxybenzyl)-1-naphthol | 3.0 parts | 2,6-di-t-butyl-4-(3,5-dimethyl-4-hydroxybenzyl)phenol | 3.4 parts | α-(3,5-di-t-butyl-4-hydroxyphenyl)-α-phenylethane | 3.2 parts |
| mercuric bromide | 0.0001 part | ← | | ← | |
| sensitizing dye a.* | 0.001 part | sensitizing dye b.* | 0.003 part | sensitizing dye c.* | 0.002 part |
| xylene | 40 parts | ← | | ← | |
| n-butanol | 40 parts | ← | | ← | |
| N,N-dimethylformamide | 0.1 part | ← | | ← | |
| methanol | 0.1 part | ← | | ← | |

*sensitizing dye a. 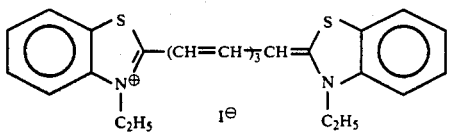

sensitizing dye b. 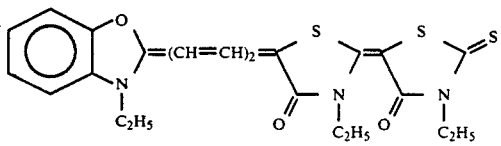

sensitizing dye c. 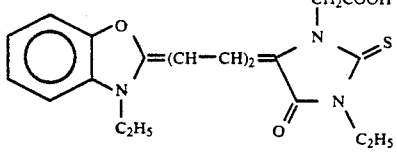

Separately, a filter solution was prepared by dissolving 2 parts of the following dye in 200 parts of alcohol.

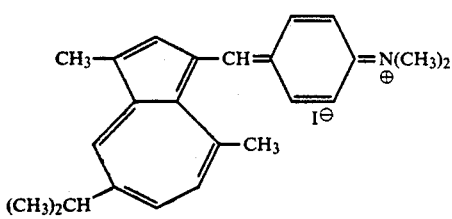

Then, 5 parts of the particles C were dispersed in 15 parts of the silver emulsion C to form a dispersion, which was then applied on a PET film to form a first photosensitive layer having a dry thickness of 5 microns. The first photosensitive layer was then coated with a dispersion comprising 5 parts of the particles D and 15 parts of the silver emulsion D to form a second photosensitive layer having a dry thickness of 5microns. Then, the second photosensitive layer was further coated with the above-prepared filter solution and dried to form a 0.5 micron-thick filter layer. Finally, the filter layer was further coated with a dispersion comprising 5 parts of the particles E and 15 parts of the silver emulsion E to form a third photosensitive layer having a dry thickness of 6 microns, whereby a photosensitive member according to the present invention was prepared.

Image formation

The above-prepared photosensitive member was subjected to imagewise exposure by using a semiconductor laser of 780 nm for a cyan image, a semiconductor laser of 670 nm for a magenta image and an He-Ne laser of 630 nm for a yellow image. Then, the photosensitive member was heated at 120° C. for 10 sec and subjected to whole-area exposure for 10 seconds from the side of photosensitive layers and then for 10 seconds from the PET film side respectively by using a ultra-high pressure mercury lamp. Then, the photosensitive member was superposed on an image-receiving paper identical to that used in Example 1, and the superposed body was heated at 110° C. for 60 sec., whereby a full color image was formed on the image-receiving paper after peeling.

What is claimed is:

1. A photosensitive member, comprising: a substrate, and a plurality of photosensitive layers laminated on the substrate;
   each photosensitive layer comprising a matrix phase and particles dispersed therein,
   the matrix phase comprising a photosensitive silver salt, an organic silver salt and a reducing agent which react with each other on exposure and heating to form a light-absorbing organic compound,
the particles comprising a heat-diffusive colorant, a polymerizable polymer precursor and a photopolymerization initiator,
the light-absorbing organic compound in a photosensitive layer being capable of absorbing a wavelength of light to which the photopolymerization initiator in the photosensitive layer is sensitive.

2. A photosensitive member according to claim 1, wherein said reducing agent is represented by the following formula (I):

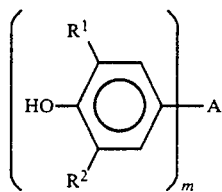

wherein $R^1$ and $R^2$ each independently represent a hydrogen atom, a hydroxyl group, a halogen atom, a substituted or unsubstituted alkyl group, a substituted or unsubstituted alkenyl group, a substituted or unsubstituted alkynyl group, a substituted or unsubstituted cycloalkyl group, a substituted or unsubstituted aralkyl group, an alkoxy group, or a substituted or unsubstituted amino group; m represents an integer of 1 to 3; and A is a monovalent, divalent or trivalent group and represents a substituted or unsubstituted aralkyl group, a substituted or unsubstituted alkyl group, a substituted amino group, a divalent alkylidene group, a divalent aralkylidene group, or a trivalent methine group.

3. A photosensitive member according to claim 1, wherein said reducing agent is represented by the following formula (II):

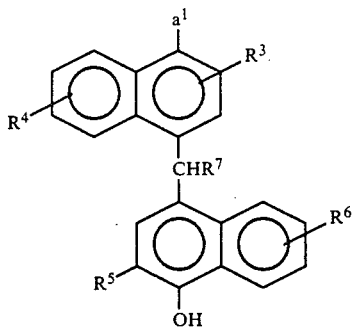

wherein $R^5$ represents a hydrogen atom, an alkyl group, a cycloalkyl group, or an aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group, and $a^1$ represents a hydrogen atom, a hydroxyl group, a halogen atom, a substituted or unsubstituted alkyl group, a cycloalkyl group, an alkoxyl group, or a substituted or unsubstituted amino group.

4. A photosensitive member according to claim 1, wherein said reducing agent is represented by the following formula (III):

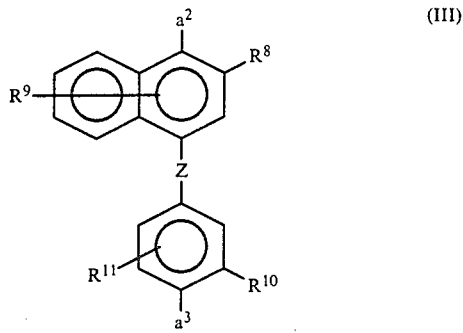

wherein $R^8$, $R^9$, $R^{10}$ and $R^{11}$ each independently represent a substituent selected from the group consisting of a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, and an acyl group; Z represents a divalent group; and $a^2$ and $a^3$ each represent a substituent selected from the group consisting of a hydrogen atom, a hydroxyl group, a halogen atom, a substituted or unsubstituted alkyl group, a cycloalkyl group, an alkoxyl group, and a substituted or unsubstituted amino group provided that at least one of $a^2$ and $a^3$ is a hydroxyl group.

5. A photosensitive member according to claim 1, wherein said matrix phase further contains a coupler.

6. A photosensitive member according to claim 5, wherein said reducing agent is selected from the group consisting of p-aminophenols, p-phenylenediamines, and o-aminophenols.

7. A photosensitive member according to claim 5, wherein said coupler is selected from the group consisting of α-acylacetamides, pyrazolones, phenols, and naphthols.

8. An image forming method of forming an image by using a photosensitive member which comprises a substrate, and a plurality of photosensitive layers laminated on the substrate; each photosensitive layer comprising a matrix phase and particles dispersed therein; the matrix phase comprising a photosensitive silver salt, an organic silver salt and a reducing agent which react with each other on exposure and heating to form a light-absorbing organic compound; the particles comprising a heat-diffusive colorant, a polymerizable polymer precursor and a -photopolymerization initiator; the light-absorbing organic compound in a photosensitive layer being capable of absorbing a wavelength of light to which the photopolymerization initiator in the photosensitive layer is sensitive; the image forming method comprising:

an imagewise exposure step for subjecting the photosensitive member to imagewise exposure to form a latent image in at least one of the photosensitive layers, a heating step for heating the photosensitive member to form a light-absorbing organic compound in the photosensitive layers corresponding to the latent image, a polymerization exposure step for exposing the photosensitive member to provide the particles with different polymerization states due to the light-absorbing characteristic of the light-absorbing organic compound, and a transfer step for heating the photosensitive member to transfer the heat-diffusive colorant to an image-receiving member depending on the polymerization states of the particles containing the heat-diffusive colorant.

9. A method according to claim 8, wherein said light-absorbing organic compound is an oxidation product formed through a reaction between the organic silver salt and the reducing agent.

10. A method according to claim 9, wherein said reducing agent is represented by the following formula (I):

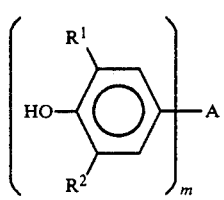

wherein $R^1$ and $R^2$ each independently represent a hydrogen atom, a hydroxyl group, a halogen atom, a substituted or unsubstituted alkyl group, a substituted or unsubstituted alkenyl group, a substituted or unsubstituted alkynyl group, a substituted or unsubstituted cycloalkyl group, a substituted or unsubstituted aralkyl group, an alkoxy group, or a substituted or unsubstituted amino group; m represents an integer of 1 to 3; and A is a monovalent, divalent or trivalent group and represents a substituted or unsubstituted aralkyl group, a substituted or unsubstituted alkyl group, a substituted amino group, a divalent alkylidene group, a divalent aralkylidene group, or a trivalent methine group.

11. A method according to claim 9, wherein said reducing agent is represented by the following formula (II):

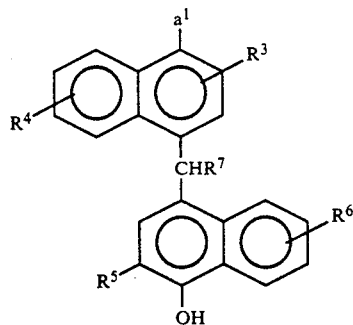

wherein $R^5$ represents a hydrogen atom, an alkyl group, a cycloalkyl group, or an aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group, and $a^1$ represents a hydrogen atom, a hydroxyl group, a halogen atom, a substituted or unsubstituted alkyl group, a cycloalkyl group, an alkoxyl group, or a substituted or unsubstituted amino group.

12. A method according to claim 9, wherein said reducing agent is represented by the following formula (III):

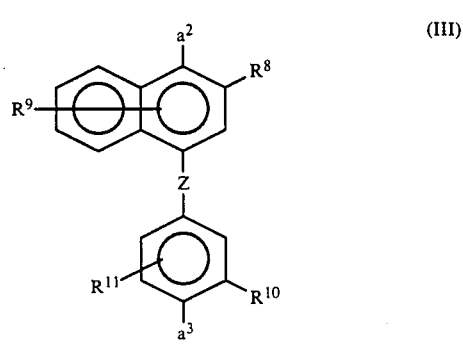

wherein $R^8$, $R^9$, $R^{10}$ and $R^{11}$ each independently represent a substituent selected from the group consisting of a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, and an acyl group; Z represents a divalent group; and $a^2$ and $a^3$ each represent a substituent selected from the group consisting of a hydrogen atom, a hydroxyl group, a halogen atom, a substituted or unsubstituted alkyl group, a cycloalkyl group, an alkoxyl group, and a substituted or unsubstituted amino group provided that at least one of $a^2$ and $a^3$ is a hydroxyl group.

13. A method according to claim 8, wherein said light-absorbing organic compound is a product of a reaction between a coupler and an oxidation product which in turn is a product of a reaction between the organic silver salt and the reducing agent.

14. A method according to claim 13, wherein said reducing agent is selected from the group consisting of p-aminophenols, p-phenylenediamines, and o-aminophenols.

15. A method according to claim 13, wherein said coupler is selected from the group consisting of α-acylacetamides, pyrazolones, phenols, and naphthols.

* * * * *

UNITED STATES PATENT AND TRADEMARK OFFICE
CERTIFICATE OF CORRECTION

PATENT NO. : 5,021,321
DATED : June 4, 1991
INVENTOR(S) : Tetsuro Fukui et al

It is certified that error appears in the above-identified patent and that said Letters Patent is hereby corrected as shown below:

COLUMN 1

Line 40, "act" should read --acts--.
    Line 60, "aye" should read --dye--.

COLUMN 4

Line 20, "causes" should read --caused--.

COLUMN 5

Line 3, "tions" should read --tion--.

COLUMN 7

Line 19, "formula:" should read --formulas:--.

COLUMN 8

Line 9, "toms" should read --atoms--.
    Line 37, "carboxybenxotriazole" should read --carboxybenzotriazole--.

COLUMN 9

Line 43, "phenetyl," should read --phenethyl,--.
    Line 44, "include," should read --includes,--.
    Line 45, "diemthylamino," should read --dimethylamino,--.
    Line 54, "i-propyl" should read --i-propyl,--.

UNITED STATES PATENT AND TRADEMARK OFFICE
CERTIFICATE OF CORRECTION

PATENT NO. : 5,021,321

DATED : June 4, 1991

INVENTOR(S) : Tetsuro Fukui et al

It is certified that error appears in the above-identified patent and that said Letters Patent is hereby corrected as shown below:

COLUMN 10

Line 24, "2,6di-t-butyl-4-benzyl-" should read
        --2,6-di-t-butyl-4-benzyl- --.
    Line 31, "2,6-di-t-" should be deleted.
    Line 32, "butyl-4-(3,5-dimethyl-4-hydroxybenzyl)phenol,"
        should be deleted.
    Line 63, "butylphenol," should read --butylphenol),--.

COLUMN 11

Line 1, "bis)3,5-di-t-" should read --bis(3,5-di-t- --.

COLUMN 12

Line 29, "phenetyl," should read --phenethyl,--.
    Line 33, "the" should read --The--.
    Line 40, "(2cyclohexyl-1-" should read
        --(2-cyclohexyl-1- --.
    Line 44, "(2-1-naphthol)," should read
        --(2-benzyl-1-naphthol),--.
    Line 54, "4-(3'cy-" should read --4-(3'-cy- --.

COLUMN 13

Line 32, "tom" should read --atom--.

UNITED STATES PATENT AND TRADEMARK OFFICE
CERTIFICATE OF CORRECTION

PATENT NO. : 5,021,321

DATED : June 4, 1991

INVENTOR(S) : Tetsuro Fukui et al

It is certified that error appears in the above-identified patent and that said Letters Patent is hereby corrected as shown below:

COLUMN 14

Line 38, "2-ethyl-4-dime-" should read --2-ethyl-4- --.
Line 39, "thylaminophenyl-1-naphthol," should read --diphenylmethyl-1-naphthol,-- and "2-methyl-4-cyclohexyl-4-" should read --2-methyl-4-(3-cyclohexyl-4- --.

COLUMN 15

Line 51, "aminonaphtols," should read --aminonaphthols,--.

COLUMN 16

Line 33, "example;" should read --example:--.
Line 52, "distyryl αα'-dichloroglutarate," should read --distyryl α,α'-dichloroglutarate--.

COLUMN 17

Line 23, "pattern" should read --between--.
Line 42, "2,4-dichlorothixanthone," should read --2,4-dichlorothioxanthone,--.
Line 46, "exemli" should read --exempli--.
Line 67, "styryl nketones" should read --styrylketones--.

UNITED STATES PATENT AND TRADEMARK OFFICE
CERTIFICATE OF CORRECTION

PATENT NO. : 5,021,321

DATED : June 4, 1991

INVENTOR(S) : Tetsuro Fukui et al

It is certified that error appears in the above-identified patent and that said Letters Patent is hereby corrected as shown below:

COLUMN 18

Line 17, "methylenebis(2-t-b ," should read --methylenebis(2-t-butyl-6-methylphenol),--.
    Line 19, "1naphthol," should read --1-naphthol,--.
    Line 21, "380 mm to 420 mm" should read --380 nm to 420 nm--.
    Line 31, "300 mm to 380 mm" should read --300 nm to 380 nm--.
    Line 40, "1naphthol)," should read --1-naphthol),--.
    Line 43, "400 mm to 520 mm," should read --400 nm to 520 nm,--.
    Line 56, "salts" should read --salt--.

COLUMN 19

Line 10, "tetralfuorodibromoethane," should read --tetrafluorodibromoethane,--.

COLUMN 20

Line 4, "filter layer 4" should read --filter layer--.
    Line 6, "filter layer 4" should read --filter layer--.
    Line 43, "poly(4,4'isopropylidene," should read --poly(4,4'-isopropylidene,--.
    Line 45, "3,3'phenylene" should read --3,3'-phenylene--.
    Line 46, "poly(4,4'-isopropylidene, isopropylidene," should read --poly(4,4'-isopropylidene, diphenylene carbonate-co-terephthalate), poly(4,4'-isopropylidene,--.

UNITED STATES PATENT AND TRADEMARK OFFICE
CERTIFICATE OF CORRECTION

PATENT NO. : 5,021,321

DATED : June 4, 1991

INVENTOR(S) : Tetsuro Fukui et al

It is certified that error appears in the above-identified patent and that said Letters Patent is hereby corrected as shown below:

COLUMN 20

Line 50, "plyamides;" should read --polyamides;--.

COLUMN 21

Line 12, "my" should read --may--.
    Line 21, "photo-polymerization" should read --photopolymerization--.
    Line 38, "U.S. Pat. Nos. 2730456 and 2800457," should read --U.S. Pat. Nos. 2,730,456 and 2,800,457,--.
    Line 58, "are" should read --is--.

COLUMN 22

Line 58, "Silver behanate" should read --Silver behenate--.

COLUMN 23

Line 44, "Silver behanate" should read --Silver behenate--.
    Line 53, "a of" should read --a solution of--.

COLUMN 24

Composition TABLE 1, "(Mw + 48 X $10^4$)" should read --MW = 48 X $10^4$)-- and "(Mw + 28 X $10^4$)" should read --(Mw = 28 X $10^4$)--.

UNITED STATES PATENT AND TRADEMARK OFFICE
CERTIFICATE OF CORRECTION

PATENT NO. : 5,021,321

DATED : June 4, 1991

INVENTOR(S) : Tetsuro Fukui et al

It is certified that error appears in the above-identified patent and that said Letters Patent is hereby corrected as shown below:

COLUMN 25

Composition Table 2, "silver behanate" should read --silver behenate--.
    Line 62, "5microns." should read --5 microns.--.

COLUMN 28

Line 50, "-photopolymerization" should read --photopolymerization--.

Signed and Sealed this

Seventeenth Day of November, 1992

Attest:

DOUGLAS B. COMER

*Attesting Officer*     *Acting Commissioner of Patents and Trademarks*